(12) United States Patent
Newman et al.

(10) Patent No.: US 6,196,002 B1
(45) Date of Patent: Mar. 6, 2001

(54) BALL GRID ARRAY PACKAGE HAVING THERMOELECTRIC COOLER

(75) Inventors: Robert Newman; Chu-Chung Lee, both of Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/338,964

(22) Filed: Jun. 24, 1999

(51) Int. Cl.⁷ .............................. F25B 21/02; H05K 7/20
(52) U.S. Cl. ............................... 62/3.7; 361/719
(58) Field of Search .................. 62/3.7, 259.2; 361/717, 718, 719; 257/469, 713

(56) References Cited

U.S. PATENT DOCUMENTS

| | | | |
|---|---|---|---|
| 5,032,897 | * 7/1991 | Mansuria et al. | |
| 5,079,618 | 1/1992 | Farnworth | 357/81 |
| 5,220,171 | * 6/1993 | Hara et al. | 62/259.2 X |
| 5,229,327 | 7/1993 | Farnworth | 437/209 |
| 5,366,527 | 11/1994 | Amos et al. | 65/382 |
| 5,456,081 | * 10/1995 | Chrysler et al. | 62/3.7 |
| 5,457,342 | 10/1995 | Herbst, II | 257/712 |
| 5,569,950 | 10/1996 | Lewis et al. | 257/467 |
| 5,572,407 | * 11/1996 | Sobhani | 361/719 |
| 5,574,627 | 11/1996 | Porter | 361/719 |
| 5,586,006 | 12/1996 | Seyama et al. | 361/719 |
| 5,637,921 | * 6/1997 | Burward-Hoy | 361/717 X |
| 5,642,261 | * 6/1997 | Bond et al. | 361/719 X |
| 5,714,791 | 2/1998 | Chi et al. | 257/467 |

(List continued on next page.)

OTHER PUBLICATIONS

ThermoElectric Cooling America Corporation, "Welcome to TECA", printed Apr. 2, 1999 from http://www.thermoelectric.com/, p. 1.

Advanced Thermoelectric Products—How and why TE modules work, "The Basics", printed Apr. 2, 1999 from http://www.americool.com/moduleworking.htm, pp. 1–2.

Advanced Thermoelectric Products—Fundamental Thermoelectrics, "The Basics", printed Apr. 2, 1999 from http://www.americool.com/basics.htm, pp. 1–2.

Advanced Thermoelectric Products, "Commercial Thermoelectric Products", printed Apr. 2, 1999 from http://www.americool.com/productslab.htm, pp. 1–2.

Advanced Thermoelectric Products, "Ready to use Thermoelectric Products", printed Apr. 2, 1999 from http://www.americool.com/products.htm, pp. 1–2.

Thermoelectric Products of NORD, "Thermoelectric Cooling Modules", printed Apr. 2, 1999 from http://www.sctb-nord.com/nord.htm, pp. 1–2.

(List continued on next page.)

Primary Examiner—Corrine McDermott
Assistant Examiner—Chen-Wen Jiang
(74) Attorney, Agent, or Firm—Foley & Lardner

(57) ABSTRACT

A package for housing a device (e.g., an integrated circuit chip or die) is disclosed including a ball grid array substrate and a thermoelectric cooler (e.g., a Peltier effect device). The thermoelectric cooler is housed within the package. The thermoelectric cooler is coupled to the ball grid array substrate and includes a hotter portion and a cooler portion in response to an electric potential difference. The thermoelectric cooler receives the electric potential difference from the package.

30 Claims, 9 Drawing Sheets

U.S. PATENT DOCUMENTS

| | | | |
|---|---|---|---|
| 5,767,489 | | 6/1998 | Ferrier ................................. 219/497 |
| 5,841,145 | | 11/1998 | Satoh et al. ...................... 250/492.22 |
| 5,887,435 | | 3/1999 | Morton .................................. 62/3.6 |
| 5,918,469 | * | 7/1999 | Cardella ................................. 62/3.7 |
| 5,982,635 | * | 11/1999 | Menzies et al. ................. 257/713 X |
| 6,060,778 | * | 5/2000 | Jeong et al. ......................... 257/710 |

OTHER PUBLICATIONS

ThermoElectric Cooling America Corporation, "Theory of Operation", printed Apr. 2, 1999 from http://www.thermoelectric.com/pg06.htm, pp. 1–3.

Pfuscher's Hardware—Project Winterm . . . oler using a TEC, heatsink and cooler, "selfmade Peltier–based cooler, 1st generation", printed Apr. 2, 1999 from http://www.pctechware.com/howto/techsfan–1.html, p. 1.

Caldera Users—Jul. 1997:Re:Peltier–effect heat sinks (Robert G. 'Doc' Savage), "Re: Peltier–effect heat sinks", printed Apr. 2, 1999 from http://www.caldera.com/mail–archives/Caldera–Users/9707/0271.html, pp. 1–2 and Caldera Users—Jul. 1997:Re:Peltier–effect heat sinks (George Bonser), "Re: Peltier–effect heat sinks", printed Apr. 2, 1999 from http://www.caldera.com/mail–archives/Caldera–Users/9707/0272.html, pp. 1–2.

Home of Lost Circuit, computer hardware guide, "The other side of the 'Peltier Effect'", printed Apr. 2, 1999 from http://www.lostcircuits.com/cpu/peltier/, pp. 1–2.

UraNet: Network Central, Network Central & Xcaliber Distribution Company, "I/O Cards & Other Things", printed Apr. 2, 1999 from http://www.uran.net/nc/locards.html, pp. 1–2.

* cited by examiner

BALL GRID ARRAY PACKAGE HAVING THERMOELECTRIC COOLER

FIELD OF THE INVENTION

The present invention relates generally to packages for integrated circuits. More specifically, the present invention relates to packages for integrated circuits having improved thermal properties.

BACKGROUND OF THE INVENTION

Thermal control is a critical consideration in any microelectronics design process. Various packaging configurations require different thermal environments to prevent device failure and to ensure predictable operating parameters. Therefore, designers of microelectronics equipment must be equipped with a range of thermal control techniques.

A conventional electronic system includes four levels of packaging complexity, each requiring special thermal considerations. The first packaging level is the chip package. Level 1 thermal packaging is concerned with conducting heat from a device (e.g., an integrated circuit (IC) chip, die or other device) to the surrounding package. The second level of packaging involves the devices attached to the printed circuit board (PCB). Level 2 addresses spreading heat from a PCB by conduction in the PCB, convection to the ambient air, or transport to the edge of the PCB. The third level is the backplane or motherboard which connects multiple PCBs, and the fourth level defines the box, rack or cabinet which houses the entire system. Level 3 and 4 typically involves the use of active thermal control systems, such as, air handling systems, refrigeration systems, etc. The principles of the present invention have particular applicability to Levels 1 and 2.

The quantity of heat that must be removed from the device has increased over the past several decades, despite the drop in transistor switching energy. Transistor switching energy has dropped from more than 1 nanoJoule in 1960 to 10 picoJoules in the early 1990s. However, cooling requirements have not diminished because device densities and operating speeds have increased. Accordingly, chip heat removal has risen from on the order of 0.1–0.3 Watts (W) in the 1960s to 15–30 W for commercial equipment in early 1990s, and could be as much as 150 W or more by the year 2000.

One problem relating to thermal control is device failure. For example, each IC contains millions of individual elements (e.g., transistors, gates, etc.). While individually these solid state elements are typically highly reliable, each with a failure rate on the order of one in one trillion devices, the increase in the number of elements per chip and number of chips per system increases the likelihood of system failure. Studies have shown that element-related functional failures exhibit a strong relationship to operating temperature. For example, a 10–20 degree Celsius increase in chip temperature may double the element failure rate under some conditions. At the packaging level, increasing structural complexity of IC packages and PCBs has increased the risk of thermally-induced failures from thermal-stress fracture of leads, joints and seals, melting of solders, cracking, etc. Furthermore, stabilization of component temperature has long been known to reduce failure rates in electronic systems.

Another problem related to thermal control is the variability of the package temperature and corresponding variability in performance. Thermal design considerations must reduce the temperature variations within the package for consistent and reliable performance. For example, complementary metal-oxide-semiconductor (CMOS) circuit speed is dependent on temperature. Thus, an increase or decrease in temperature may affect cycle times or timing margins.

Several proposed solutions to the above thermal control design challenges are in common usage today. Among passive thermal control techniques, ambient air is the most common and preferred coolant. Heat sinks, which utilize finned or extended surfaces to increase the surface area exposed to a coolant, are also popular. Among active thermal control techniques, blown air, pumped water and circulated refrigerants are sometimes used. While these techniques may provide adequate thermal control properties for some applications, future design constraints will require improved temperature control systems. Furthermore, since many thermal control designs require a combination of heat removal techniques, new design tools are always welcome by thermal control designers, as new packaging configurations introduce new thermal control challenges.

Thermoelectric cooling (TEC) devices, such as, Peltier effect devices have been used in a variety of applications from consumer products (e.g., water coolers and wine cellar chillers) to laboratory, scientific and industrial products (e.g., test tube coolers, thermal baths). A typical thermoelectric module includes two ceramic substrates with doped P-type and N-Type semiconductive material (e.g., bismuth telluride) connected electrically in series and thermally in parallel between the ceramic substrates. Conductive pads (e.g., copper pads) are coupled to each semiconductive material and act as electrical contacts. A power source is coupled to the conductive pads. As current flows in series through the semiconductive materials, one ceramic substrate will become hotter than ambient temperature and the other ceramic substrate will become colder than ambient temperature.

U.S. Pat. No. 5,457,342 to Herbst, II discloses one prior device in which a thermoelectric device is coupled to the outside of an IC package. In this device, a heat conductive base plate is placed against the package of an IC. The cooling surface of a Peltier effect module is coupled to the base plate. A heat radiator assembly is coupled to the heating surface of the Peltier effect module, and a fan assembly is juxtaposed next to a heat-radiating portion of the heat radiator assembly. The fan assembly and Peltier effect module are powered in parallel by a 12 VDC power source. In operation, the Peltier effect module cools the top surface of the IC package, and the fan assembly and heat radiator assembly cool the heating surface of the Peltier effect module. In this device, however, the Peltier effect module is coupled to the outside of the IC package and, therefore, the heat that can be removed by the Peltier effect module is limited to that heat which makes it to the outside of the IC package.

U.S. Pat. No. 5,079,618 to Farnworth discloses another prior system in which a two-posted Peltier semiconductor is mounted to a support member for an IC package. A copper lead frame member, a heat sink member, and an IC or transistor are mounted thereon. Interconnect wires couple power input leads of the IC package to the IC and the Peltier effect device to provide power to the IC and the Peltier effect device. Although this system discloses a Peltier effect device inside an IC package, the package is a dual in-line package (DIP) and requires delicate internal wiring that makes the wiring susceptible to shorts or cracking. Furthermore, most ICs today that require added power dissipation are larger devices embodied in more advanced packaging, such as, ball grid array (BGA) packaging.

Accordingly, what is needed is a new thermal control system that overcomes the challenges of applying Peltier effect technology to advanced packaging systems, such as, BGA packaging.

SUMMARY OF THE INVENTION

The present invention addresses these and other limitations by providing, according to one embodiment, a package for housing a device having a ball grid array substrate, a device coupled to the substrate and a thermoelectric cooler coupled to the substrate. The thermoelectric cooler has a hotter portion and a cooler portion in response to an electric potential difference. The thermoelectric cooler receives the electric potential difference from conductive contacts with the package.

According to another embodiment of the present invention, a package for housing a device is provided. The package includes a package substrate, a device and a thermoelectric cooler. A portion of the thermoelectric cooler protrudes a first distance outside the package substrate.

According to yet another embodiment of the present invention, a method of cooling a device in a ball grid array package is disclosed. The method includes supplying an electric potential from within the ball grid array package to a thermoelectric device and removing heat from the device through the thermoelectric device.

According to yet another embodiment of the present invention, a method of manufacturing a ball grid array package having a thermoelectric device is disclosed. The method includes providing a support plate having a protrusion, providing a ball grid array substrate having an aperture adapted for substantially mating alignment with the protrusion, and providing a thermoelectric cooler in the aperture, whereby the protrusion provides alignment of the thermoelectric cooler within the ball grid array substrate.

BRIEF DESCRIPTION OF THE DRAWINGS

The invention will become more fully understood from the following detailed description, taken in conjunction with the accompanying drawings, wherein like reference numerals refer to like parts, and in which.

DETAILED DESCRIPTION OF THE PREFERRED EMBODIMENTS

Figure 1:
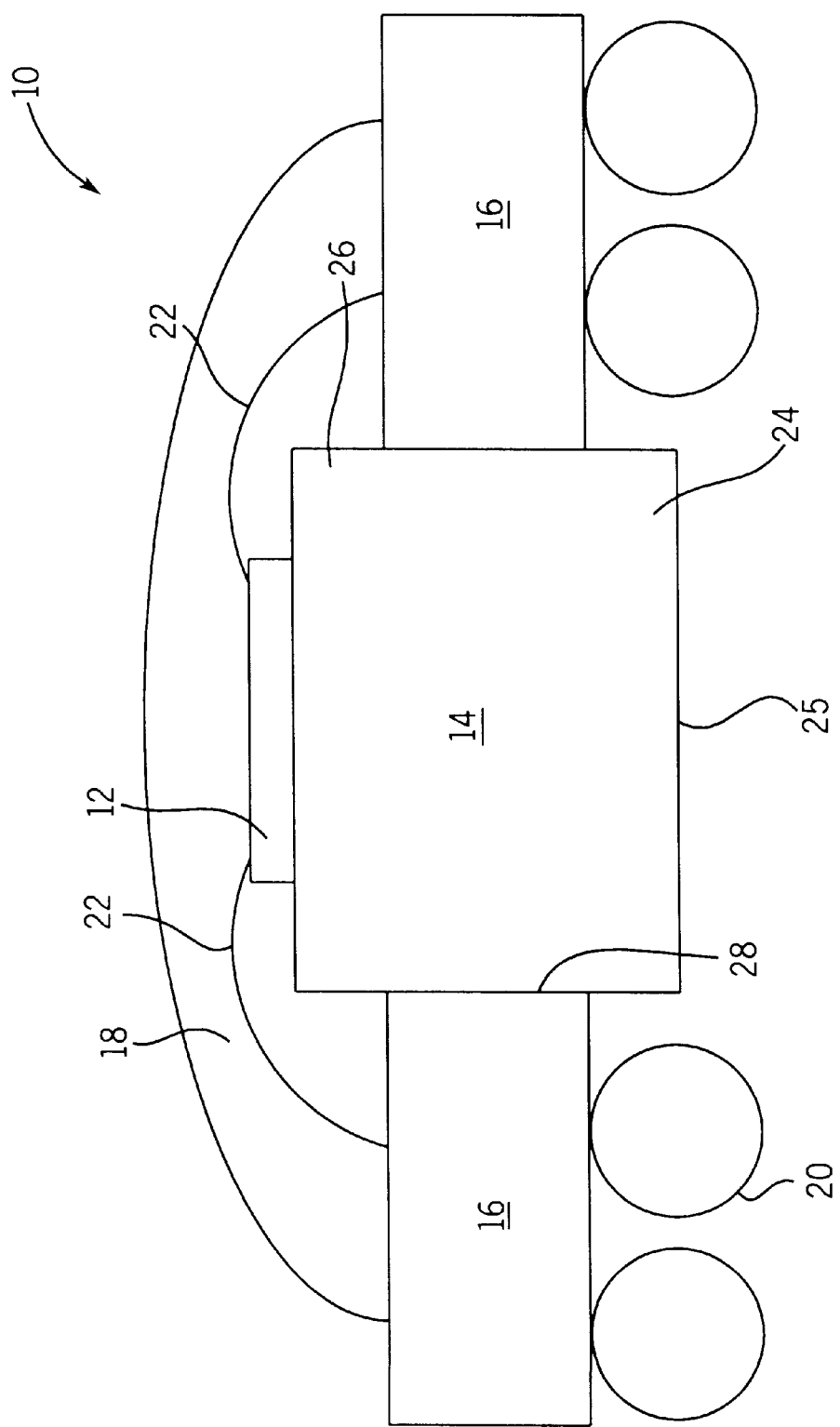
FIG. 1 is a diagram of a package having a thermoelectric cooler according to one embodiment of the present invention.

Referring to FIG. 1, a diagram of a package having a thermoelectric cooler according to one embodiment of the present invention is shown. In this embodiment, package 10 includes a device (e.g., a die) 12, a thermoelectric cooler 14, a package substrate 16 and an encapsulant 18. Device 12 is a microprocessor in this embodiment, but may also be programmable logic memory, or other electronic devices that require thermal control. Package substrate 16 is a multi-layer ball grid array (BGA) substrate including a plurality of electrical contacts 20 (e.g., solder balls). Various inputs and outputs of device 12 are coupled through bond wires 22, package substrate 16 and electrical contacts 20 to a printed circuit board (not shown) or other board or device. Package 10 may alternatively be configured as a quad flat pack, chip size package (in which the packaging is just slightly larger than the die) and direct chip attach package (in which the chip is directly connected to the circuit board).

In this embodiment, thermoelectric cooler 14 includes a first portion 24 and a second portion 26. Thermoelectric cooler 14 is square in cross-section and, thus, is adapted to fit matingly within a square aperture 28 in package substrate 16. Other shapes and configurations can also be utilized. In this embodiment, first portion and second portion comprise alumina or other conductive material and the middle portion of cooler 14 comprises bismuth telluride. Thermoelectric cooler 14, in this embodiment, has dimensions of approximately 8.0×8.0×1.77 millimeters (mm). Device 12 is approximately 5.3×5.3×0.31 mm. Package substrate 16 is approximately 27.0×27.0×0.90 mm. Electrical contacts 20 are, for example, solder balls having a diameter of 0.7 mm. As can be seen from FIG. 1, thermoelectric cooler 14 extends above and below package substrate 16 with an extension of approximately 0.44 mm in each direction. In this configuration, thermoelectric cooler 14 does not extend downward the full height of electrical contacts 20 since contacts 20 will melt when applied to a printed circuit board (PCB). Thus, thermoelectric cooler 14 may or may not make contact with the PCB when placed thereon. In one embodiment, thermoelectric cooler 14 does come in contact with the PCB and sinks heat thereto for subsequent dispersal, as will be described hereinafter. Preferably, the PCB includes a large heat conductive medium where cooler 14 contacts the PCB. For example, the PCB can include a large copper contact area for receiving cooler 14.

Figure 3:
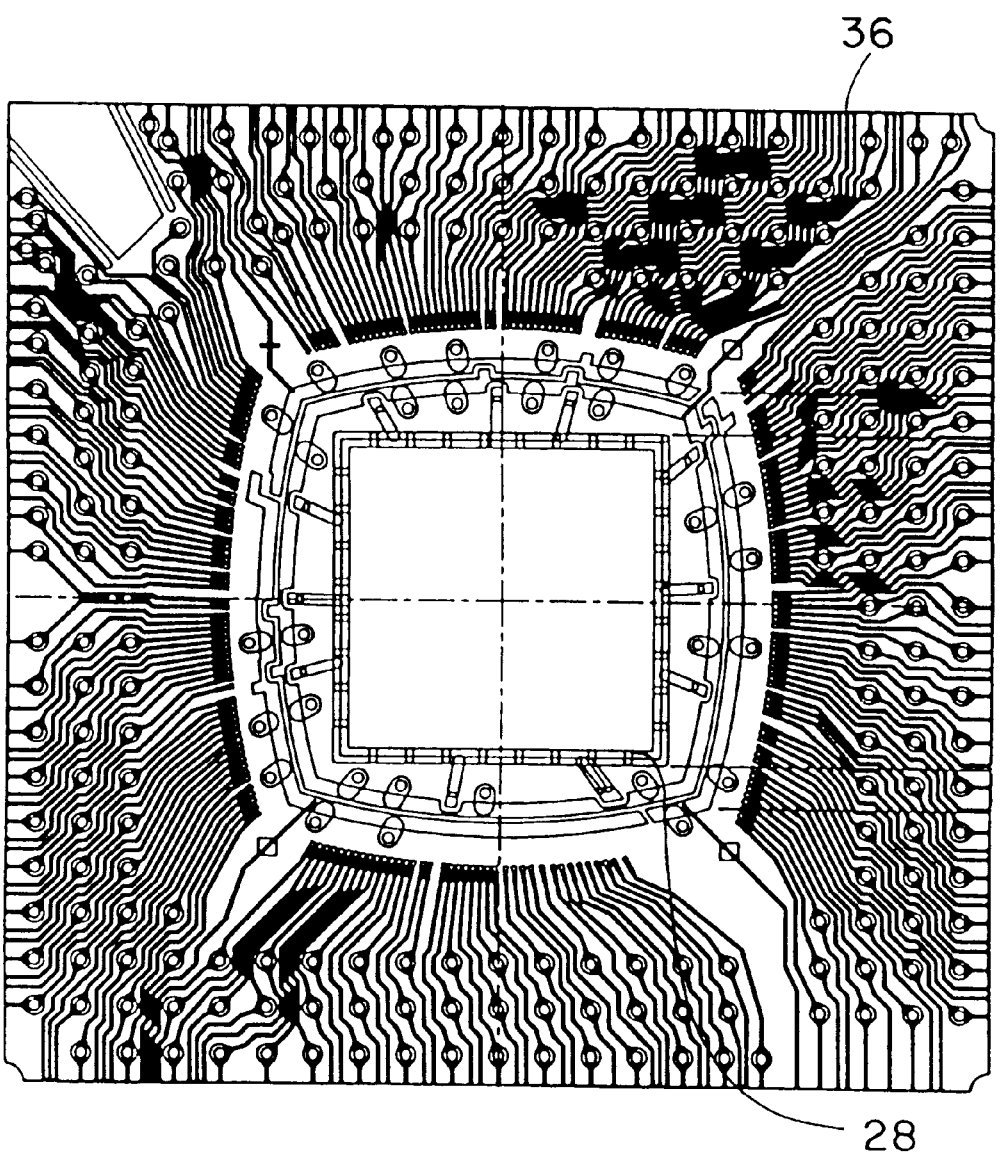
FIG. 3 is a top view of the package substrate of FIG. 1 having a hole adapted to receive a thermoelectric cooler.

Encapsulant 18 is a plastic or other insulative material, in this example comprising anhydride, and serves to protect device 12 and bond wires 22. Package substrate 16 may be plastic or ceramic and has a plurality of layers, the top and bottom layers. An example of the top layer of package substrate 16 is shown in FIG. 3, disclosing various conductive lines 36 and an aperture 28 adapted to receive thermoelectric cooler 14. Note that the various electrical connections of package substrate 16 must be arranged to allow for the introduction of aperture 28. Device 12 may be coupled by flip-chip (4C), wire bond or other method to thermoelectric cooler 14 and/or package substrate 16. Additional electrical contacts 20 may be provided on the hotter portion of thermoelectric cooler 14 to sink heat to an adjoining PCB, one embodiment of which will be described hereinafter with reference to FIG. 5.

Figure 4:
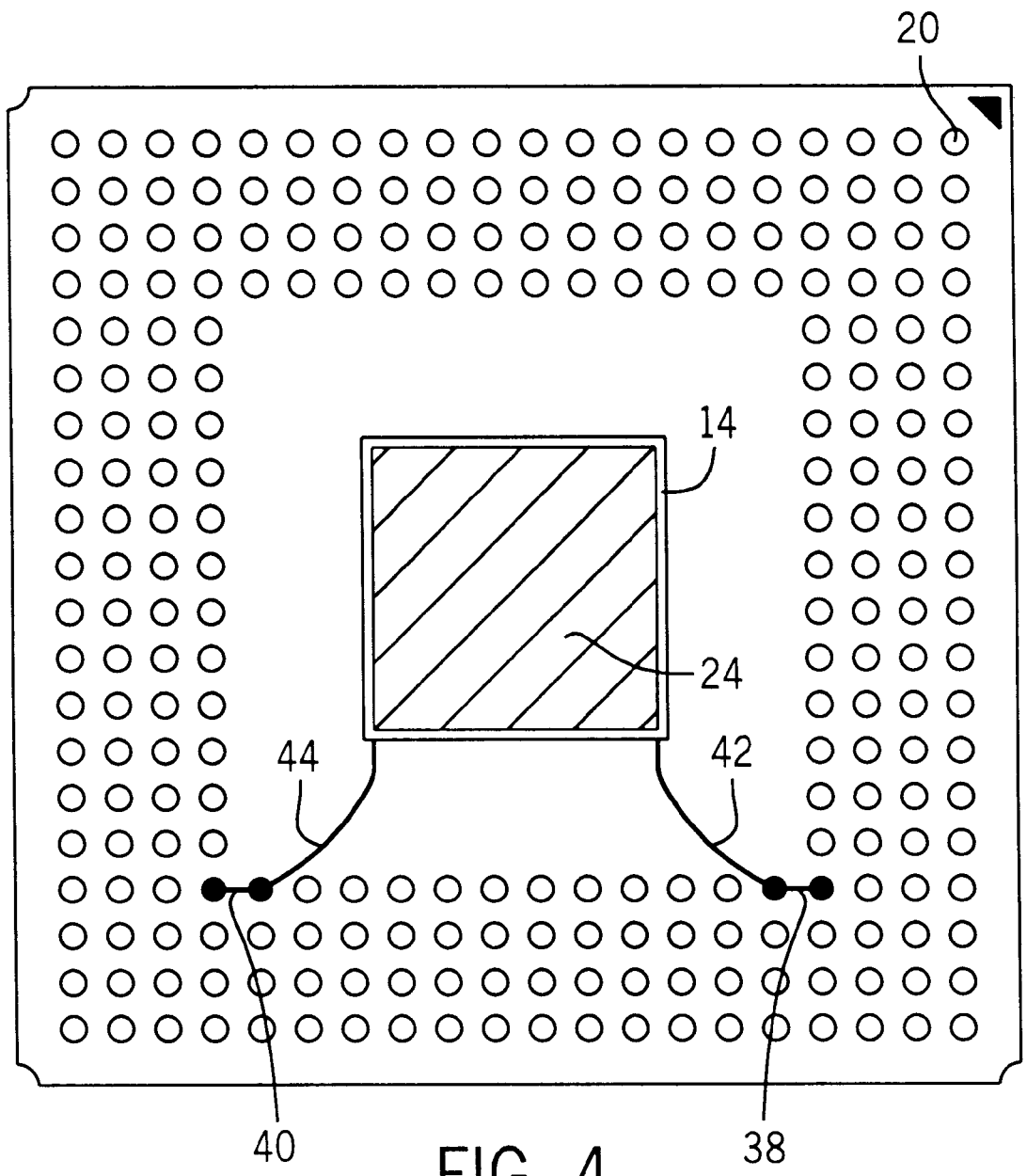
FIG. 4 is a bottom view of the package substrate of FIG. 1.

Package 10 is manufactured as follows. Aperture 28 is routed, cut or otherwise formed in substrate 16. Aperture 28 may be routed slightly larger than thermoelectric cooler 14 for a loose fit, or approximately the same size as thermoelectric cooler 14 for an interference fit. Typically, a plurality of substrates 16 are provided on a support plate or assembly surface. Thermoelectric cooler 14 is then placed in aperture 28 and, if loosely fitting, an epoxy, adhesive, or other coupling is applied at the juncture between cooler 14 and substrate 16. Next, electrical connections are made between first portion 24 of thermoelectric cooler 14 and contacts on substrate 16. Specifically, a positive electric potential is provided via these contacts. Alternatively, these contacts may provide a ground or other reference voltage. With reference to FIG. 4, a bottom view of package substrate 16 is shown in which a power contact 38 and a ground contact 40 are electrically coupled via wires 42, 44 (e.g., copper or other conductive material) to first portion 24 of thermoelectric cooler 14.

Device 12 is then coupled with epoxy, adhesive, solder or other coupling to cooler 14, and is subsequently wire bonded via bond wires 22 to package substrate 16. In this embodiment, one of bond wires 22 provides a ground or other reference voltage to device 12. Device 12 provides this ground reference through a ground plate in electrical contact with second portion 26 of cooler 14. Alternatively, power may be provided to cooler 14 by device 12. As a further alternative, package substrate 16 could provide one or both of power and ground directly to cooler 14 from one of the layers of package substrate 16 via conductive terminals coupled to printed wire conductors. Encapsulant 18 is then applied over device 12 and bond wires 22 to protect the structure. Electrical contacts 20 are then applied to package substrate 16 to form solder balls or other electrically conductive terminals. Package 10 may subsequently be coupled to a motherboard or other system.

It is understood that various configurations of powering cooler 14 by package 10 are contemplated. For example, the power and ground of cooler 14 may switch sides based on the type of semiconductive material the cooler is constructed of (e.g., N-type or P-type) and based on whether device 12 is coupled above cooler 14 or below it. According to another alternative embodiment, device 12 and cooler 14 may include powers and grounds electrically isolated from one another. One advantage of including a separate power and ground for thermoelectric cooler 14 and device 12 is the ability to adjust the electric potential across thermoelectric cooler 14, or to remove the electric potential from cooler 14 entirely without removing power from device 12. For example, a temperature control system could be employed, including a temperature sensor coupled to device 12, in which the temperature sensor provides a feedback signal to a control circuit, the control circuit adjusting the electric potential across thermoelectric cooler 14 in accordance with the received feedback signal.

In operation, thermoelectric cooler 14 receives an electric potential difference from one or more of electrical contacts 20, device 12 and package substrate 16. When an electric potential difference is applied between first portion 24 and second portion 26, first portion 24 heats up and second portion 26 cools down (Peltier effect). Since the cold portion of the thermoelectric device is in close thermal contact with the IC chip, a cooling of the IC chip takes place. When the IC chip is in operation it will naturally heat up in relationship to its power consumption. A thermoelectric cooling of the backside of the chip can control its temperature in the presence of this Joule heating, keeping the temperature of the IC chip within an acceptable range. The net effect of the thermoelectric cooler is to pump heat from the die backside to hotter portion 24 of the thermoelectric cooler. The electric potential applied across hotter portion 24 and cooler portion 26 is a DC potential. This heat sinking serves to cool device 12. Hotter portion 24 transfers this heat to an exterior surface 25 of package 10 and disperses this heat by convection, heat sinks or other active or passive thermal control techniques. In this embodiment, package 10 dissipates over five Watts, while it is understood that other embodiments may dissipate more or less heat depending upon the configuration.

Figure 2A:
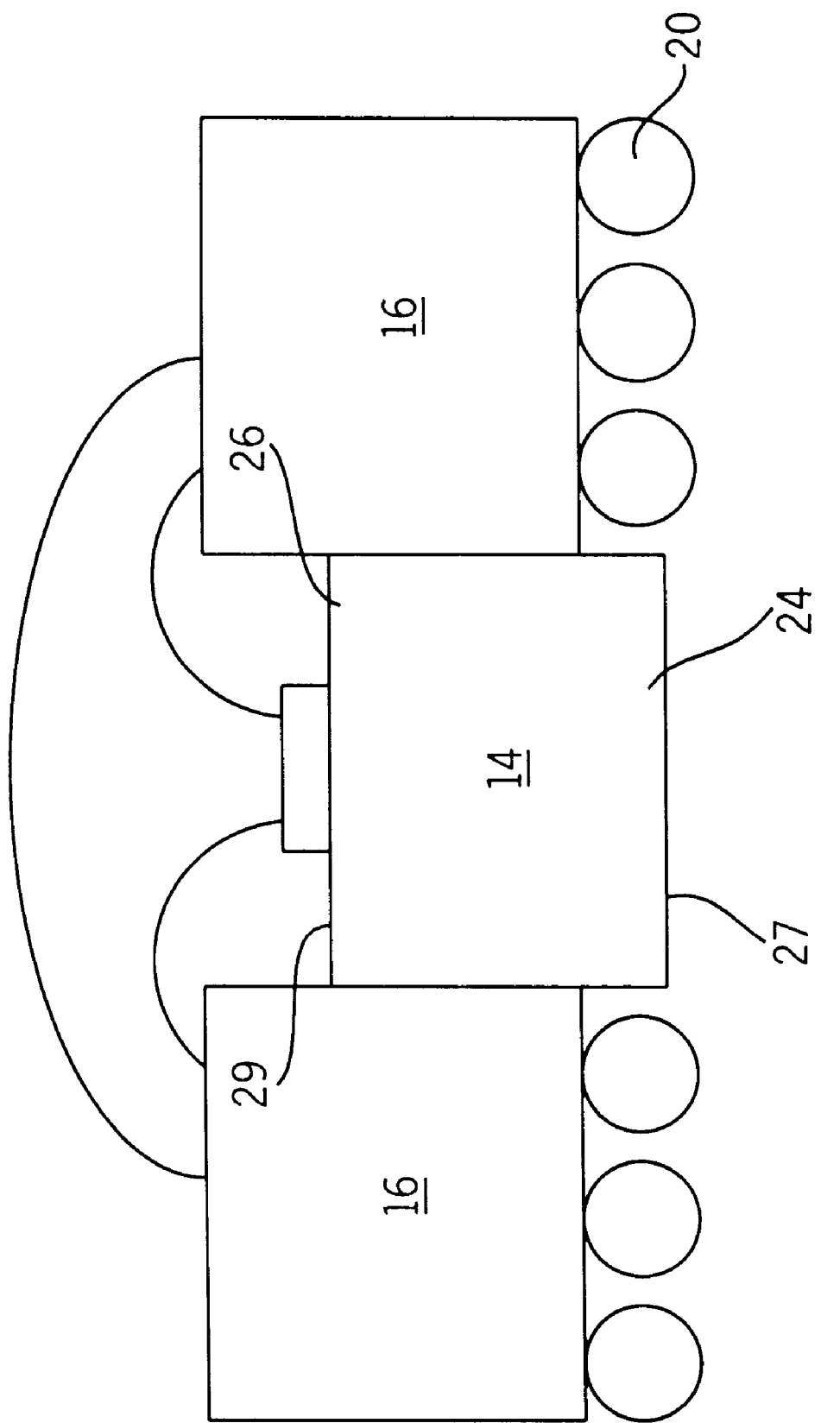
FIGS. 2A–2E depict an alternative embodiment of the package of FIG. 1 along with several steps in a process of manufacturing a plurality of packages according to the alternative embodiment.

Referring now to FIGS. 2A–2E, an alternative embodiment of the package of FIG. 1 is disclosed along with a method of manufacturing the alternative embodiment. One distinguishing feature of this package substrate, as shown in FIG. 2A, is that thermoelectric cooler 14 is recessed within package substrate 16 at second portion 26, but extends from package substrate 16 at first portion 24 with suitable alignment with respect to electrical contacts 20. This method serves to properly align thermoelectric cooler 14 in substrate 16 so that, for example, thermoelectric cooler 14 makes contact with a motherboard, a layer of thermal paste or adhesive, or another surface to facilitate heat transfer thereto. Accordingly, cooler 14 may be recessed within substrate 16 such that a bottom surface 27 protrudes from substrate 16 approximately one-half the diameter or height of contacts 20, and a top surface 29 is recessed within substrate 16 a corresponding distance.

Figure 2B:
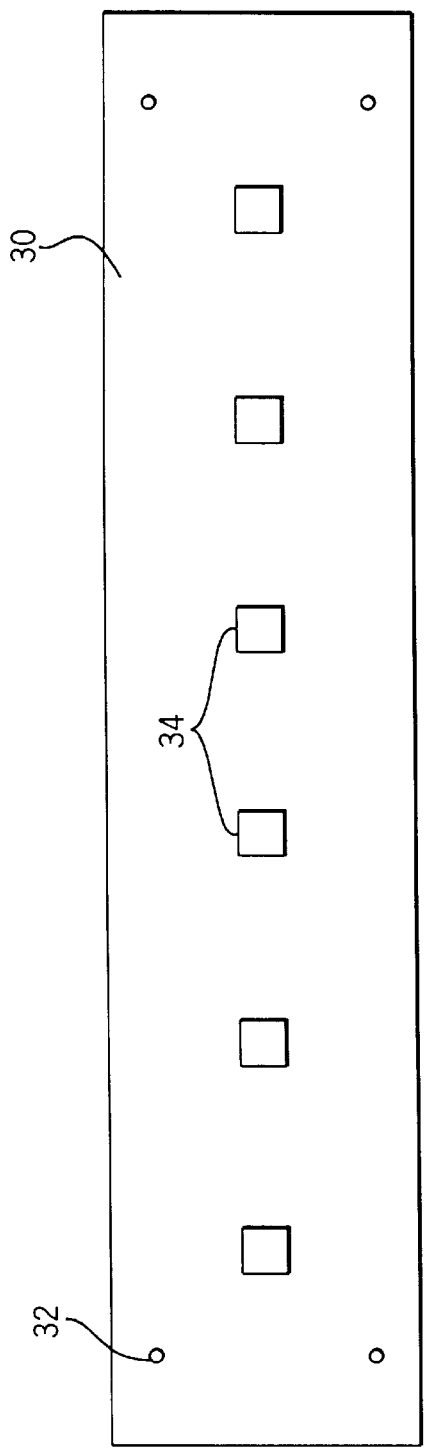
Figure 2C:
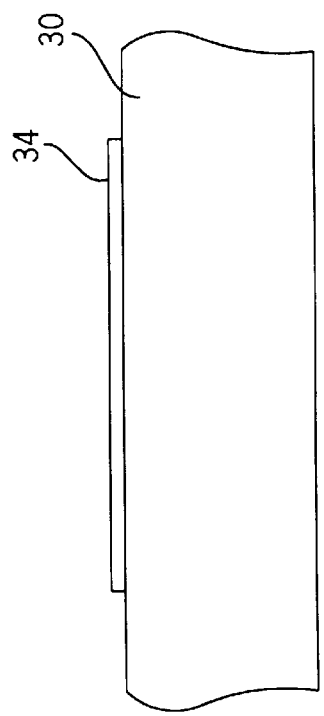

Referring to FIG. 2B, a support plate 30 is provided having an alignment pin 32 and a plurality of protrusions 34. Protrusions 34 are sized and shaped to fit within aperture 28 in package substrate 16. Aperture 28 is formed by cutting or routing package substrate 16 to provide an aperture sized and shaped suitable for receiving a thermoelectric cooler 14 either loosely or in an interference-fit configuration. As shown in FIG. 2C, a partial enlarged side view of support plate 30, protrusions 34 extend a small distance from support plate 30 (e.g., approximately 0.16 millimeters in this embodiment). When thermoelectric cooler 14 is placed against protrusion 34, first portion 24 of cooler 14 also protrudes the same small distance from package substrate 16, which aligns first portion 24 with approximately the middle of the extension of electrical contacts 20 from substrate 16.

Figure 2D:
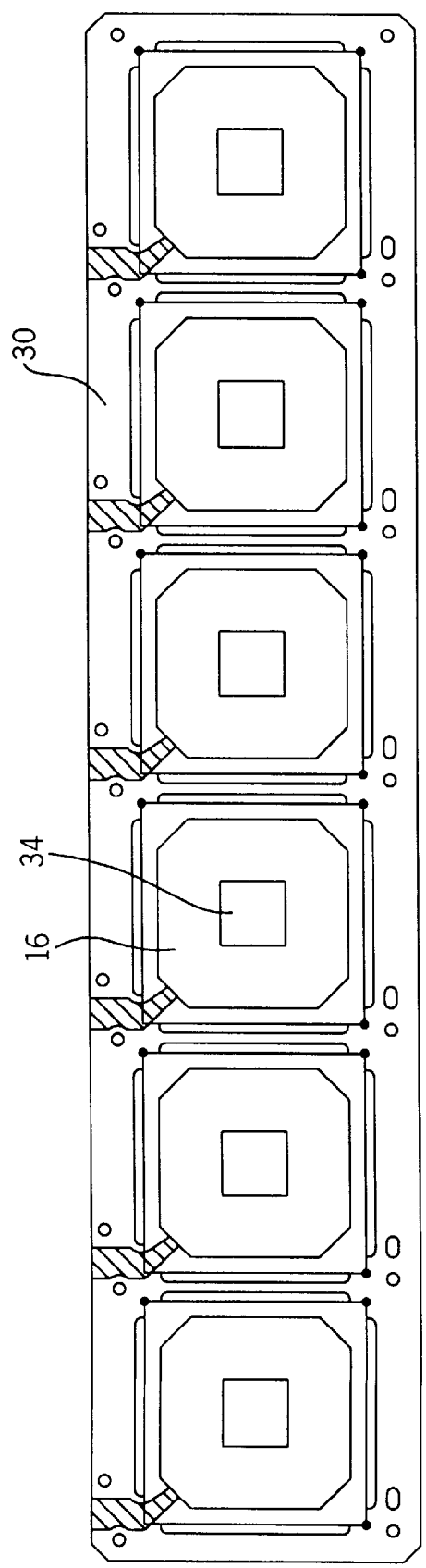
Figure 2E:
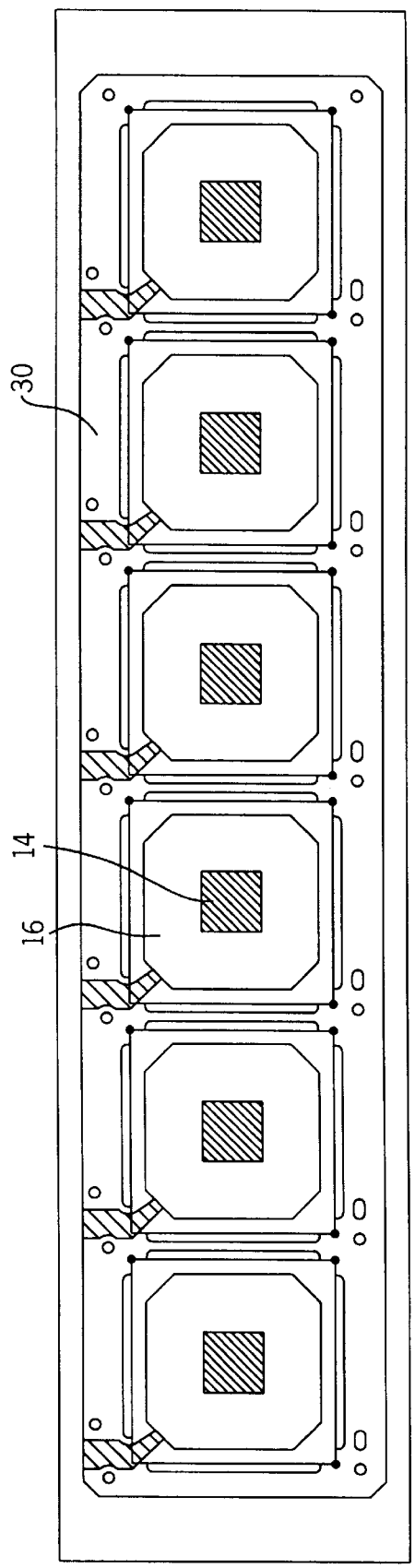

Next, with reference to FIG. 2D, a plurality of package substrates (e.g., a "strip" of six package substrates in this embodiment) are provided over protrusions 34, preferably with the bottom layer of the substrate facing upward. In one embodiment, an epoxy or other adhesive is applied within apertures 28. As shown in FIG. 2E, thermoelectric coolers 14 are then provided within the apertures.

Next, power and/or ground connections are made between appropriate electrical contacts 20 of package substrate 16 and first portion 24 of thermoelectric cooler 14. Subsequently, device 12 is coupled to the opposite side of the side shown in FIG. 2E of thermoelectric cooler 14 using one of the methods described hereinbefore or other known methods. Encapsulant 18 is further provided over device 12 as described hereinabove. Package 10 is then coupled to a printed circuit board or other mother board.

Figure 5:
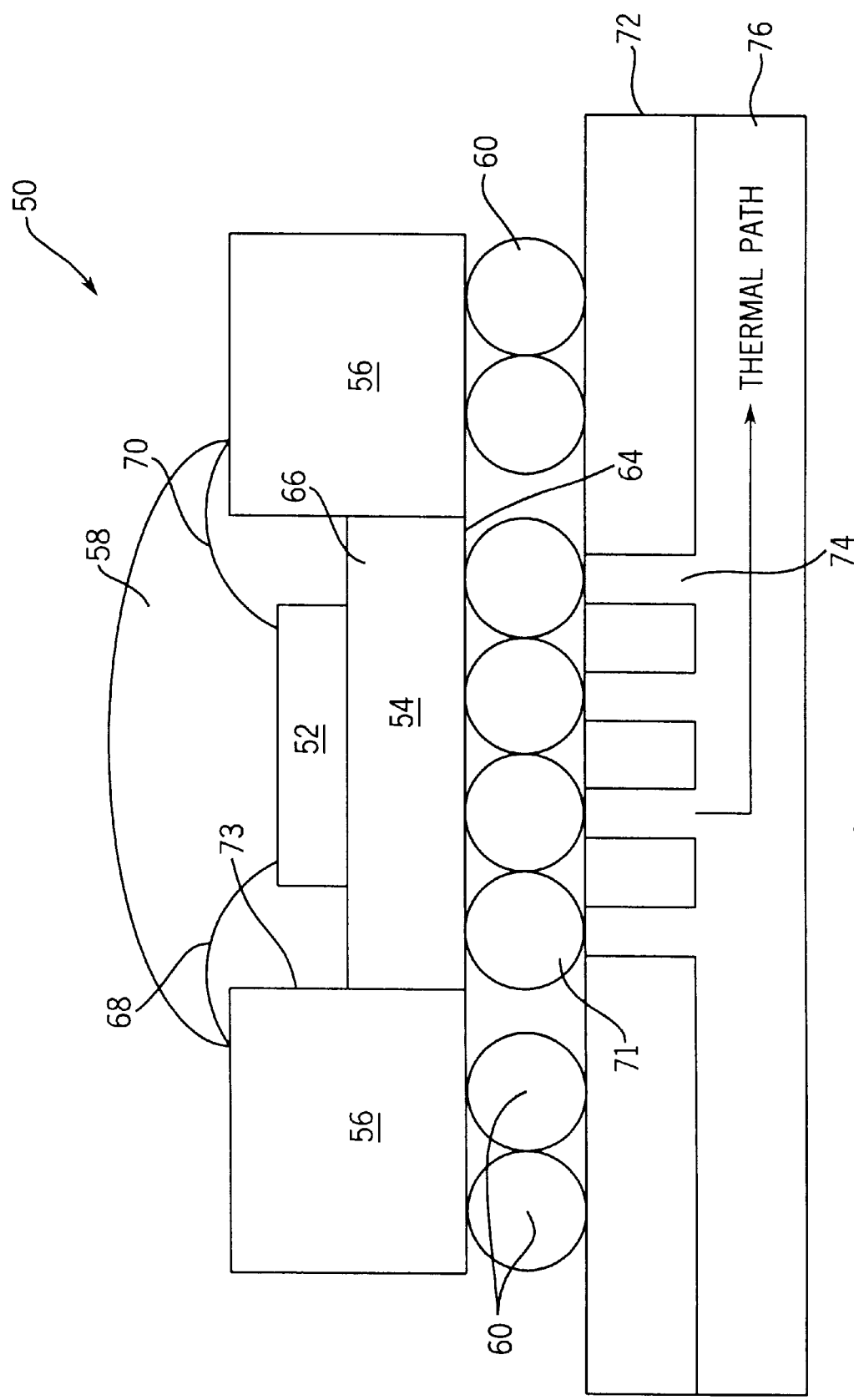
FIG. 5 is a diagram of a package having a thermoelectric cooler, the package coupled to a printed circuit board according to an alternative embodiment of the present invention.

Referring now to FIG. 5, an alternative embodiment of package 10 is shown. A package 50 includes a device 52, a thermoelectric cooler 54, a package substrate 56, an encapsulant 58 and a plurality of electrical contacts 60. In this embodiment, device 52 and thermoelectric cooler 54 are both placed within package substrate 56 and coupled thereto by interference fit, adhesive, electrical contacts or some combination thereof. In this embodiment, device 12 is somewhat smaller than cooler 54 and is recessed within aperture 73 of substrate 56. Thermoelectric cooler 54 includes a hotter portion 64 and a cooler portion 66. Package substrate 56 provides power and ground to device 52 via wires 68 and 70, respectively. Thermoelectric cooler 54 receives one of power and ground from an electrical contact with device 52 and the other of power or ground from electrical connection with a respective power or ground of electrical contacts 60. Alternatively, both power and ground can be provided from device 12, from electrical contacts 60 or from package substrate 56. Other combinations of electrical couplings with thermoelectric cooler 54 to provide power thereto are contemplated.

In this embodiment, a plurality of thermal contacts 71 (e.g., thermal balls) are provided at hotter portion 64 of thermoelectric cooler 54. Package 50 is coupled to a board 72 (e.g. a mother board or PCB), board 72 including thermal vias 74 and a conducting layer 76. Thermal vias 74 are filled with a good thermally conductive material, such as a metal. Preferably, this metal is the same metal as that of conducting layer 76.

In operation, when an electric potential is provided across thermoelectric cooler 54, heat is sunk from device 52 and/or package substrate 56 through thermal contacts 71 and through thermal vias 74 to conducting layer 76. Subsequently, heat is dissipated by convection (e.g., with the use of a fan) or otherwise from conducting layer 76. Alternatively, thermoelectric cooler 54 may be placed directly in contact with thermal vias 74 to transfer heat thereto. It is noted that the various electrical connections and layers of package substrate 56 must be rearranged to allow for the introduction of aperture 73. A heat sink can be attached to conducting layer 76.

Figure 6:
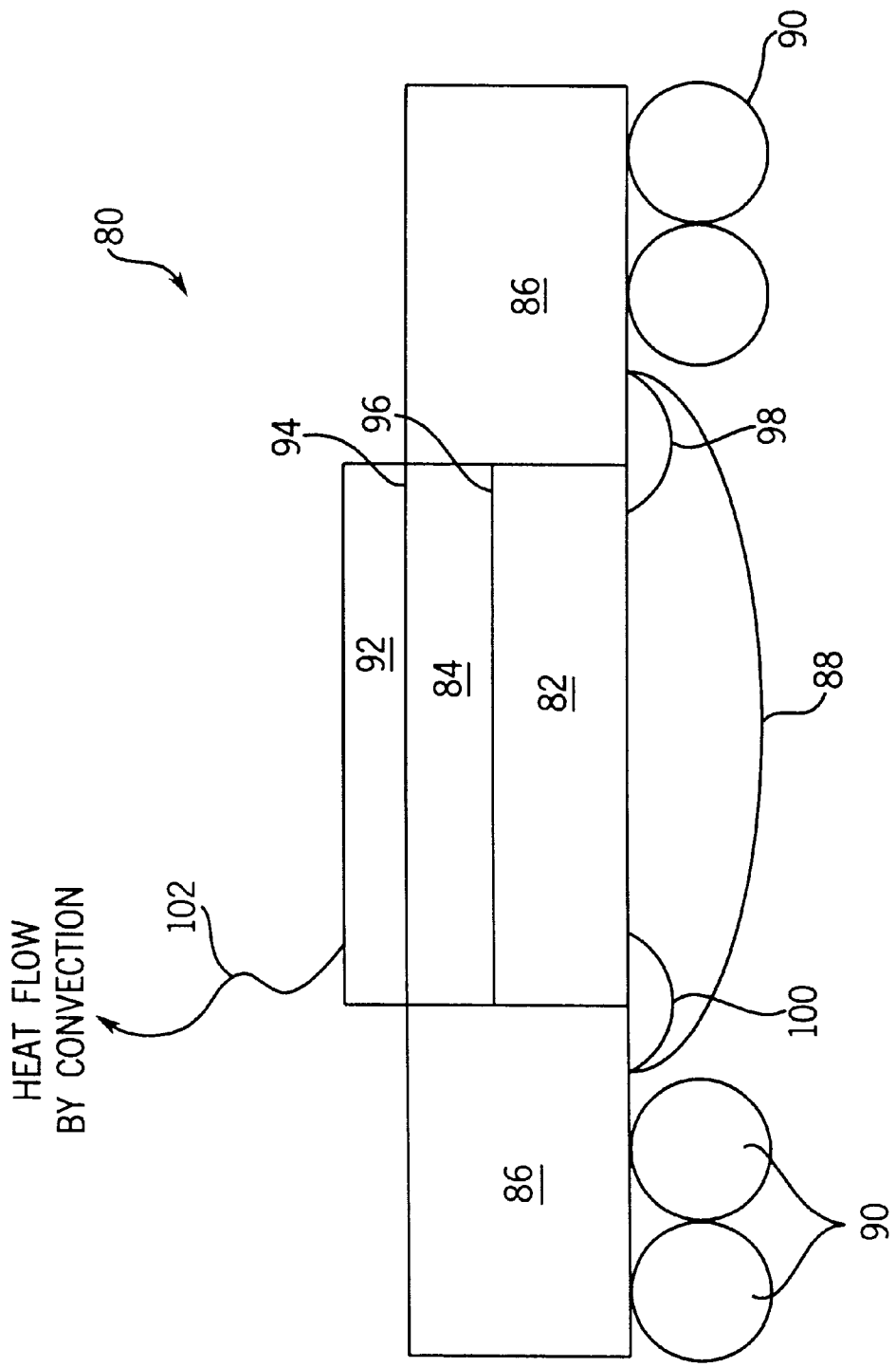
FIG. 6 is a diagram of a package having a thermoelectric cooler according to another of the many alternative embodiments of the present invention.

Referring now to FIG. 6, yet another alternative embodiment of the present invention is disclosed. A package 80 includes a device 82, a thermoelectric cooler 84, a package substrate 86, an encapsulant 88 and a plurality of electrical contacts 90. A heat sink 92 is further provided and is coupled to a hotter portion 94 of thermoelectric cooler 14, a cooler portion 96 of thermoelectric cooler 14 being coupled to device 82.

In this embodiment, device 82 is powered by wire bond or other electrical contacts 98, 100, which are coupled to package substrate 86 and provide power therefrom. Heat sink 92 preferably includes fins or other known shapes to improve the convective flow of heat from heat sink 92 to the ambient air, as indicated by arrow 102. Power is provided to thermoelectric cooler 84 via package substrate 86, and ground is provided to thermoelectric cooler 84 via a ground plate or other ground contact with device 82. Alternatively, power and ground may be provided to thermoelectric cooler 84 from device 82 and package substrate 86 in various other configurations.

A number of design considerations are addressed by the various embodiments of the present invention in order to make a suitable ball grid array package for housing a thermoelectric cooler. In the various embodiments shown, the coefficient of thermal expansion of each of the materials in the package affects the design layout and selection of materials. These thermal expansion co-efficients must be taken into consideration when designing a package such as a ball grid array package to prevent cracking and shorting, and to build in stress relief to the package. Second, most applications of thermoelectric coolers are in a significantly larger scale than that presented herein. As a Peltier effect device is miniaturized, electrical characteristics are changed. The dimensions of the Peltier affect device disclosed with reference to FIG. 1 indicate one suitable miniaturization of the device. Third, the materials of the present invention have been selected to prevent corrosive properties of the various materials within the package. Fourth, the Peltier effect device configuration disclosed herein is one that is not unreasonably cost prohibitive. Additionally, the heat dissipation of the embodiments disclosed herein are suitable to remove a sufficient amount of heat (e.g., 10–15 Watts or more), which is suitable for microprocessors, such as, the K6 microprocessor, manufactured by Advanced Micro Devices, Inc.

While the embodiments illustrated in the FIGURES and described above are presently preferred, it should be understood that these embodiments are offered by way of example only. For example, alternative materials and electrical contact configurations are contemplated as further examples of embodiments suitable to address the thermal expansion, miniaturization, corrosion and other design considerations addressed by the embodiments disclosed. The invention is not limited to a particular embodiment, but extends to various modifications that nevertheless fall within the scope of the appended claims.

What is claimed is:

1. A package for housing a device, comprising:
a ball grid array substrate;
a device coupled to the substrate; and
a thermoelectric cooler coupled to the device and positioned at least partially within the substrate, the thermoelectric cooler having a hotter portion and a cooler portion in response to an electric potential difference, the thermoelectric cooler receiving the electric potential difference from conductive contacts with the package.

2. The package of claim 1, wherein the thermoelectric cooler includes a Peltier effect substrate.

3. The package of claim 2, wherein the Peltier effect substrate includes doped bismuth telluride.

4. The package of claim 1, wherein the ball grid array substrate includes a hole and the thermoelectric cooler is disposed within the hole.

5. The package of claim 1, wherein the ball grid array substrate is electrically coupled to a circuit board, further comprising a thermally conductive layer coupled to the board, wherein the hotter portion of the thermoelectric cooler is configured to transfer heat to the thermally conductive layer, the thermally conductive layer configured to dissipate the heat.

6. The package of claim 5, wherein the thermoelectric cooler is located between the device and the board and the board is located between the ball grid array substrate and the thermally conductive layer.

7. The package of claim 6, further comprising a thermally conductive path between the thermoelectric cooler and the thermally conductive layer, the path comprising thermal balls coupled to the thermoelectric cooler and thermal vias in the board coupled between the thermal balls and the conductive layer.

8. The package of claim 1, wherein the package dissipates over five Watts.

9. The package of claim 1, wherein a heat sink is thermally coupled to the hotter portion of the thermoelectric cooler.

10. The package of claim 1, further comprising an encapsulant in contact with the ball grid array substrate, the device, and the thermoelectric cooler.

11. The package of claim 1, wherein the thermoelectric cooler is approximately 113 mm$^3$ or less in size.

12. A package for housing a device, comprising:
a package substrate having a ball grid array;
a device coupled to the package substrate;
a thermoelectric cooler coupled to the package substrate, wherein a first portion of the thermoelectric cooler is within the package substrate, wherein a second portion of the thermoelectric cooler protrudes a first distance outside the package substrate.

13. The package of claim 12, wherein the second portion of the thermoelectric cooler includes the hotter portion.

14. The package of claim 12, wherein the first portion of the thermoelectric cooler is a cooler portion and is thermally coupled to the device.

15. The package of claim 14, wherein the first cooler portion is recessed within the package substrate a second distance, wherein the first distance and second distance are approximately equal.

16. The package of claim 12, wherein the first portion of the thermoelectric cooler is a cooler portion, wherein the device is coupled to the first, cooler portion of the thermoelectric device, the device being recessed within the package substrate.

17. The package of claim 12, further comprising an encapsulant in contact with the package substrate, the device, and the thermoelectric cooler.

18. The package of claim 12, wherein the thermoelectric cooler is approximately 113 mm$^3$ or less in size.

19. A method of cooling a device in a ball grid array package, the method comprising:
supplying an electric potential to a thermoelectric device within the ball grid array package; and
removing heat from the device through the thermoelectric device.

20. The method of claim 19, wherein the electric potential is provided to leads on the t hermoelectric device.

21. The method of claim 19, wherein the electric potential is provided to the thermoelectric device via printed wire conductors.

22. The method of claim 19, wherein the thermoelectric device is a Peltier effect substrate, the Peltier effect substrate having a cooler surface and a hotter surface in response to the electric potential, wherein the cooler surface is closer to the device than the hotter surface.

23. The method of claim 19, wherein heat from the device is conducted through the thermoelectric device to an exterior surface of the ball grid array package.

24. The method of claim 19, wherein the thermoelectric device is approximately 113 mm$^3$ or less in size.

25. A method of manufacturing a ball grid array package having a thermoelectric device, comprising:
providing a support plate having a protrusion;
providing a ball grid array substrate having an aperture adapted for substantially mating alignment with the protrusion; and
providing a thermoelectric cooler in the aperture, whereby the protrusion provides alignment of the thermoelectric cooler within the ball grid array substrate.

26. The method of claim 25, wherein the aperture and protrusion are substantially square in shape.

27. The method of claim 25, further comprising electrically coupling the thermoelectric cooler to the ball grid array substrate.

28. The method of claim 25, wherein the ball grid array substrate has a plurality of electrical contacts on one side, the one side being placed away from the support plate.

29. The method of claim 25, wherein the protrusion protrudes approximately one-half the height of the electrical contacts.

30. The method of claim 25, further comprising providing an encapsulant over the thermoelectric cooler, wherein the encapsulant is in contact with the ball grid array substrate and the thermoelectric cooler.

* * * * *